Figure 1:
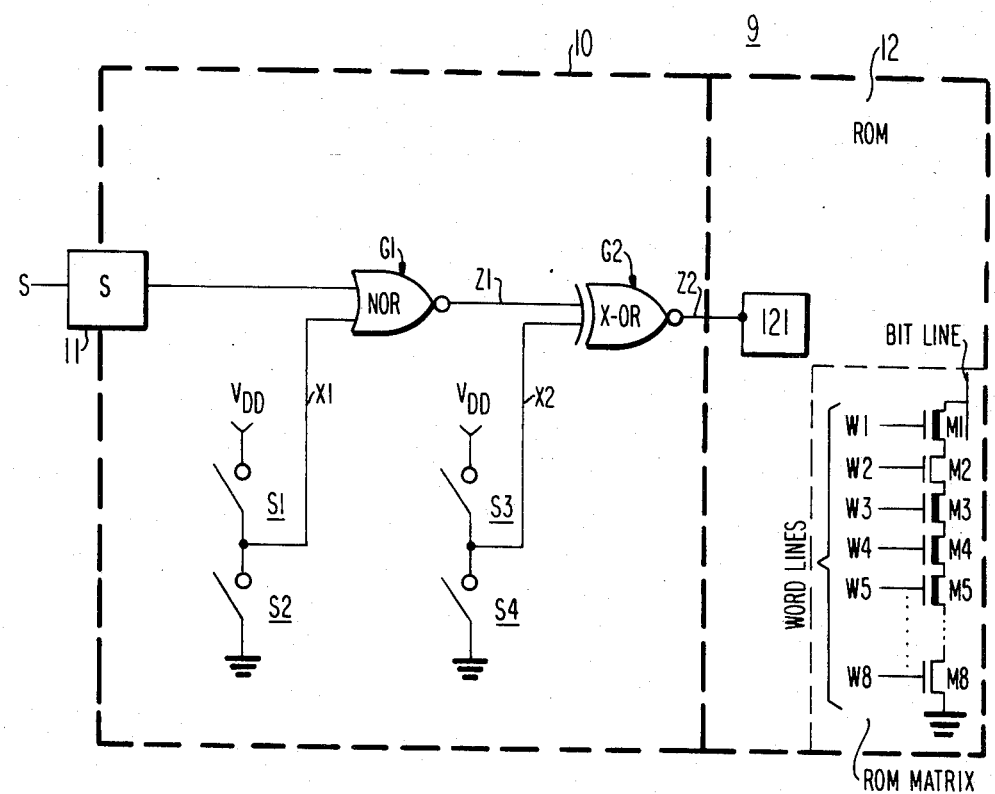

United States Patent [19]

Pollachek

[11] Patent Number: 4,612,459
[45] Date of Patent: Sep. 16, 1986

[54] PROGRAMMABLE BUFFER SELECTIVELY SETTABLE TO OPERATE IN DIFFERENT MODES

[75] Inventor: Robert G. Pollachek, Bridgewater, N.J.

[73] Assignee: RCA Corporation, Princeton, N.J.

[21] Appl. No.: 615,557

[22] Filed: May 31, 1984

[51] Int. Cl.[4] .................. H03K 17/693; H03K 19/096
[52] U.S. Cl. .................... 307/468; 307/465; 307/469; 307/471; 307/475
[58] Field of Search ............................. 307/452–453, 307/443, 465, 468–469, 471, 475; 364/716; 365/233, 94

[56] References Cited

U.S. PATENT DOCUMENTS

| | | | |
|---|---|---|---|
| 3,691,401 | 9/1972 | Forlani et al. | 307/468 X |
| 4,084,105 | 4/1978 | Teranishi et al. | 307/468 X |
| 4,157,480 | 6/1979 | Edwards | 307/465 |
| 4,292,548 | 9/1981 | Suarez et al. | 307/448 X |
| 4,482,822 | 11/1984 | Kamuro et al. | 307/463 X |

OTHER PUBLICATIONS

Mead & Conway, Introduction to VLSI Systems, Addison-Wesley Pub. Co. Reading, Mass., Oct., 1980, pp. 150–156.
Kotecha, "Electrically Alterable Non-Volatile Logic Circuits", IBM TDB, vol. 24, No. 7B, Dec. 1981, pp. 3811–3812.

Primary Examiner—Stanley D. Miller
Assistant Examiner—D. R. Hudspet
Attorney, Agent, or Firm—Joseph S. Tripoli; Henry I. Schanzer

[57] ABSTRACT

A programmable buffer settable by means of control signals to function either as: (a) an inverting buffer; (b) a non-inverting buffer; or (c) to produce a fixed output level independent of the value of its input signal.

9 Claims, 4 Drawing Figures

PROGRAMMABLE BUFFER SELECTIVELY SETTABLE TO OPERATE IN DIFFERENT MODES

This invention relates to buffer circuitry and, in particular, to a buffer circuit which can be programmed to operate in different modes to convert a variety of different "user" signals into standard signals.

A problem exists in the design of an electronic circuit intended for use by many different customers ("users") where different users generate different signals to drive, operate, or enable the circuit. For example, a read only memory (ROM) chip normally has one or more chip select terminals to which enabling signals are applied to render the ROM operable. Some users require that the ROM be rendered operable (i.e. selected) when the user supplied enabling signals are "high". Other users require that the ROM be selected when the user supplied enabling signals are "low". Still others require that the ROM always be enabled, i.e. that it be operable, regardless of the value of the signals applied to the chip select terminals.

The different user requirements are incompatible with each other. As a consequence, it is common for the manufacturer of ROM chips to offer different versions of the same chip. This increases the cost of manufacture and decreases the general usefulness of the chips. It is therefore desirable and advantageous to manufacture a standard part capable of being easily modified to meet different user requirements.

Accordingly, circuits embodying the invention include a programmable buffer circuit which can be programmed to produce an output which is either in phase with the signal at its input, out of phase with the signal at its input, or has a fixed value independent of the value of the input signal. Thus programmed, a variety of different user signals applied to the buffer input result in the production at its output of "standard" signals capable of driving, operating or enabling a "standard" circuit.

Figure 2:
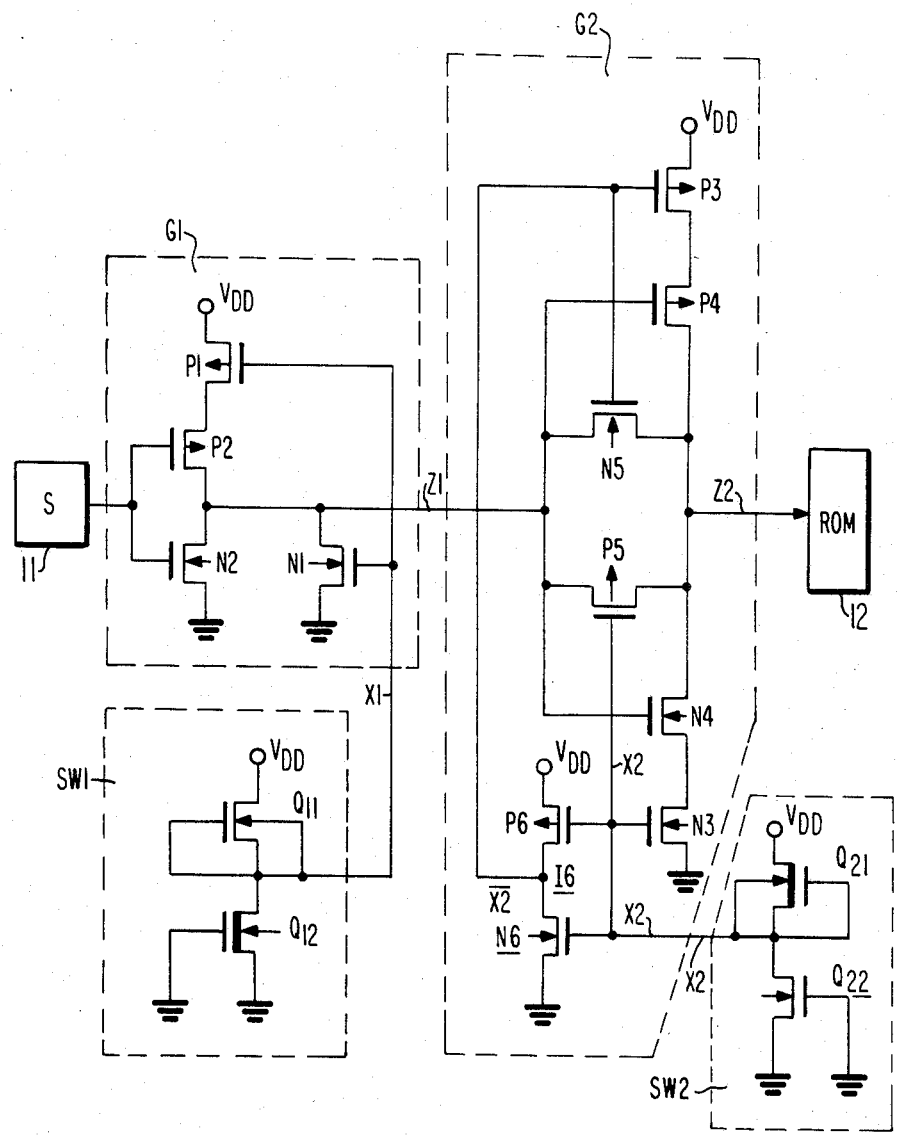
Figure 3B:
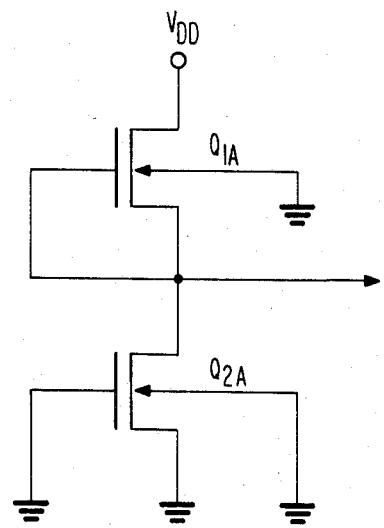
Figure 3A:
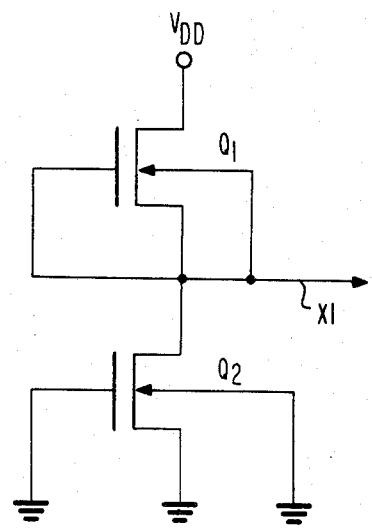

In the accompanying drawing, like reference characters denote like components; and FIG. 1 is a partial schematic partial block diagram of circuitry embodying the invention, FIG. 2 is a schematic diagram of a programmable buffer circuit embodying the invention, and FIGS. 3A and 3B are schematic diagrams of switching arrangements suitable for use in the circuits of FIGS. 1 and 2.

The logic circuitry necessary to form a programmable buffer embodying the invehtion is contained in dashed box 10 of FIG. 1. An external command signal, S, which may be, for example, a customer (or user) generated chip select command is applied to an input terminal 11. The signal S and a first programmable signal X1 are applied to respective inputs of a two-input NOR gate G1. The output, Z1, of gate G1 and a second programmable signal X2 are applied to respective inputs of a two-input exclusive OR gate G2. The output Z2 of gate G2, applied to a terminal 121 of a ROM 12, functions as the internally generated signal to select ROM 12. In the discussion to follow, it is assumed that when Z2 is high, ROM 12 is selected and rendered operable and when Z2 is low, ROM 12 is deselected and rendered inoperable.

The value of the signal X1 applied to gate G1 may be set at $V_{DD}$ volts (logic "1" or "high") by closing switch S1 and opening switch S2. Alternatively, X1 may be set to ground (logic "0" or "low") by opening switch S1 and closing switch S2 thereby clamping or coupling X1 to ground. Likewise, the signal X2 applied to gate G2 may be set high by closing switch S3 and opening switch S4, or X2 may be set low by opening switch S3 and closing switch S4.

The programmable buffer 10 may be formed on an integrated circuit 9 which includes the ROM 12. ROM 12 may be any one of a number of known read only memories.

For ease of the discussion to follow, assume that:

1. ROM 12 is of the type shown in U.S. Pat. No. 4,142,176 titled "Series Read Only Memory Conductor" issued to Howard W. Dozier, whose teachings are incorporated herein by reference;

2. the ROM 12 matrix of memory elements is customized to meet a user's request by ion implantation during a part of the manufacturing process. Ion implantation is used to alter the conductivity of selected memory elements contained in ROM matrix 12. By way of example, prior to ion implantation, all of the memory elements of ROM 12 are initially manufactured as insulated-gate field-effect transistors (IGFETs) of the enhancement type. Ion implantation of selected (i.e. programmed) elements turns them into depletion type transistors. A depletion type transistor, as is known in the art, conducts even when the potential applied between its gate and source is zero volts. The non-selected (i.e., non-programmed) elements in the array retain their enhancement type characteristic. That is, the potential applied between their gate and source must exceed some threshold voltage, $V_T$, for them to conduct; and 3. ROM 12 is enabled or rendered operative when a signal (e.g. Z2) applied to its input 121 is high. When Z2 is low, ROM 12 is deselected or rendered inoperative.

As noted above, the problem resolved by the invention is that ROM 12 is to be enabled in response to the different user requirements listed below:

1. One user requirement calls for ROM 12 to be enabled when the user supplies a "high" input signal (S), referred to herein as an external active high condition;

2. Another user requirement is that ROM 12 be enabled in response to a "low" input signal, referred to herein as an external active low condition; and 3. Still another user requirement is that ROM 12 be enabled regardless of the value of the signal S applied to input terminal 11.

These different and mutually exclusive user requirements may be satisfied by programming the buffer 10 by means of switches S1, S2, S3 and S4. That is, by varying the settings of switches S1, S2, S3 and S4, control signals X1 and X2 may be selectively set "high" or "low". Each one of X1 and X2 is selectively set high or low to ensure that programmable buffer 10 functions either: (1) as a non-inverting buffer when a high user signal, S, is intended to enable ROM 12; or (2) as an inverting buffer when a low user signal, S, is intended to enable ROM 12; or (3) to provide a fixed (e.g. high) output level regardless of the value of the input signal when so required by the user.

Consequently, for the assumption that Z2 high enables ROM 12, the control signals X1 and X2 can be set to the ("high" or "low") states necessary to drive internal chip select signal Z2 to the "high" enable condition whenever a user requires ROM 12 to be enabled.

I. It will now be shown that the internal chip enable signal, Z2, will be set or driven to the high condition in response to an externally active high input condition (i.e. S is high), when X1 is set low and X2 is set high. When X1 is low, NOR gate G1 functions as an inverter whereby the output Z1 of G1 is equal to $\bar{S}$, the complement or inverse of S. Therefore, with X1 set low, Z1 is high when S is low, and Z1 is low when S is high. Gate G2 is an exclusive-OR gate whose output (Z2) is high whenever its two inputs Z1 and X2 are at different logic states (i.e. X2 is high, Z1 is low, or X2 is low and Z1 is high), and whose output is low when its two inputs (X2 and Z1) have the same binary value (i.e. X2 and Z1 are high or X2 and Z1 are low). Recall that with X1 set low, Z1 is low when S is high. Applying Z1 low to gate G2 when X2 is set high, causes Z2 to be high. Therefore, it has been shown that with X1 set low and X2 set high, Z2 is driven high when S is high. Hence, with X1 set low and X2 set high, ROM 12 is enabled (selected) when S is high.

For X1 set low, Z1 is driven high when S is low. Since X2 is set high, the two inputs (X2 and Z1) to G2 are now both "high" and its output Z2 will then be driven low causing ROM 12 to be deselected.

II. It will now be shown that the internal chip select signal Z2 will be set "high" in response to an external active low input signal (i.e. S is low) when X1 and X2 are both set to the low level. When X1 is low, NOR gate G1 functions as an inverter, and its output Z1 is equal to $\bar{S}$, as noted above. Recall that Z1 and X2 are applied to the inputs of exclusive-OR gate G2. When X2 is low, and Z1 is high (resulting from S being low) the output Z2 of G2 goes high. Therefore, for X1 and X2 set low, Z2 is driven high when S is low. Hence, ROM 12 is selected when the external or user applied input signal S is low.

For the case of X1 low, Z1 is driven low when S is high. Since X2 is set low, the two inputs (X2 and Z1) to G2 are both low and its output, Z2, will be driven low causing ROM 12 to be deselected.

III. It will now be shown that Z2 can be set high regardless of the value of the input signal S by setting X1 and X2 high. Note that this condition corresponds to a logical "don't care" state. For the condition of X1 being high, Z1 is clamped low regardless of the value of S. Applying Z1 low and X2 high to gate G2 causes Z2 to be set high. With Z2 set high, ROM 12 is enabled and can be readily operated.

Z2 may be set or driven to the permanently low condition by setting X1 high and X2 low. Since it was assumed that a high Z2 is necessary to select ROM 12, setting X1 high and X2 low would result in ROM 12 being permanently disabled. This is not a practical condition for the instant example and is not discussed further.

Programmable buffer 10 has been illustrated using a NOR gate and an exclusive OR gate. However, it should be evident that other circuit combinations performing the same or similar function could be used instead. That is, a circuit may be used instead of the circuitry shown in box 10 of FIG. 1 which is selectively settable to produce either: (a) an inverting function; (b) a non-inverting function; or (c) a fixed output independent of the input signal.

The circuitry shown in FIG. 2 illustrates an actual implementation of the logic diagram of FIG. 1. P-type IGFETs P1 and P2 are interconnected with N-type IGFETs N1 and N2 to form a two-input NOR gate G1. One input to NOR gate G1 is the external input signal S which is applied to the gate electrodes of P2 and N2. The other input to gate G1 is the signal X1, derived from network SW1, which is applied to the gate electrodes of transistors N1 and P1. The output Z1 of gate G1 is applied to one input of exclusive OR gate G2 which is formed using P-type IGFETs P3, P4, P5 and P6 and N-type IGFETs N3, N4, N5 and N6. The second input to gate G2 is the signal X2 derived from network SW2.

Z1 is applied to the gate electrodes of P4 and N4 and to one end of the conduction paths of P5 and N5. The drains of P4 and N4 and the other end of the conduction paths of P5 and N5 are connected to the output of gate G2 at which is produced the "internal" enabling signal Z2 applied to ROM 12. X2 is applied to the gate electrodes of N3 and P5 and to the gate electrodes of P6 and N6 which form a complementary inverter I6. The output, $\overline{X2}$, of inverter I6 is applied to the gate electrodes of P3 and N5. The conduction path of P3 is connected between VDD and the source of P4 and the conduction path of N3 is connected between the source of N4 and ground.

Each one of networks SW1 and SW2 includes two IGFETs of N-conductivity type. That is, SW1 includes Q11 and Q12 and SW2 includes Q21 and Q22. As illustrated in FIG. 3A, transistors Q11, Q12, Q21 and Q22 are initially formed as enhancement devices. With respect to each network SWi, the drain of the Qi1 transistor (where i=1 or 2) is connected to $V_{DD}$ while its gate and source electrodes and its substrate are connected to the drain of the Qi2 transistor and to a common output line on which is generated the Xi signal. The gate and source electrodes and the substrate of Qi2 are returned to ground potential. Since transistors Q11, Q12, Q21 and Q22 are N-type transistors and since their gate and source electrodes are connected in common, they do not conduct (except for leakage) when they are in their enhancement state.

Transistors Q11, Q21, Q12 and Q22 are formed at the same time as the memory transistors in ROM 12. In their virgin state (i.e. before being implanted, or programmed), all the memory transistors in ROM 12 as well as transistors Q11, Q21, Q12 and Q22 are formed as enhancement type devices. All these transistors may be initially manufactured as part of a standard integrated circuit (IC) chip in which all the transistors may be of the same enhancement type. At a point in the manufacturing process the ROM is customized to embody a bit pattern required by a user. By way of example, the pattern may be set into the ROM by ion implantation. The ion implantation as noted above, is aimed at altering the conductivity of selected enhancement transistors such that the selected transistors become depletion type transistors (i.e. they can conduct even with zero gate to source potential). Depletion type transistors are illustrated in the drawing by a darkening of the "conduction portion" of the transistor between the source and drain region. Thus, for example, in ROM 12, as detailed in ROM matrix portion of FIG. 1, transistors M1, M3, M4 and M5 have been altered to be depletion type transistors.

A significant aspect of the invention is that when the bit-pattern is set in the ROM array to meet the user's coding requirements, selected ones of transistors Q11, Q12, Q21 and Q22 may be concurrently modified to cause X1 and X2 to assume the values necessary to cause Z2 to assume a high state for the input signal conditions for which the user wants the ROM 12 to be enabled.

Only a single photolithographic mask need be modified to concurrently provide the ROM 12 coding for a particular user and the reconfiguration of programmable buffer 10 such that the input signals applied by the user to terminal 11 properly operate the ROM. The reconfiguration of programmable buffer 10 is accomplished by means of threshold voltage adjustments which is a relatively simple means of setting and controlling the different modes of operation of buffer 10. Thus, any one of the three buffer functions discussed above can be programmed into buffer 10 for a particular ROM user during the same single masking step used for bit pattern selection. This masking step may be a depletion implant type of threshold adjustment, as used for series NAND-stack type ROM cell arrays as shown in ROM matrix portion of FIG. 1. Since no additional masking levels need be altered to change the chip selection logic function, this allows a more cost efficient customization than those requiring additional interconnect changes or logic block replacement.

Returning to the circuit of FIG. 2, Q12 and Q21 are shown to be depletion type transistors. However, it should be evident that other combinations are possible.

For example, Q11 may be made a depletion type transistor with Q12 remaining as an enhancement type transistor. For this condition, Q11 would be conducting coupling X1 to $V_{DD}$ while Q12 would be non-conducting. Hence, X1 would be high. For the condition shown in FIG. 2, Q11 is maintained as an enhancement type transistor while Q12 was altered to be a depletion type transistor. Q11 does not conduct and appears as a high impedance whereas Q12 provides a relatively low impedance conduction path to ground causing X1 to be at or close to ground potential, i.e. low. Similarly, with Q21 turned into a depletion type transistor and Q22 remaining an enhancement type transistor as shown in FIG. 2, X2 is coupled via a relatively low impedance to $V_{DD}$ and thus appears as a high signal. Q22 is non-conducting and appears as a very high impedance to ground. Alternatively, Q22 could be turned into a depletion device and Q21 retained in the enhancement mode. Thus when Q11 is enhanced and Q12 is depleted, X1 is low and when Q11 is depleted and Q12 is enhanced, X1 is high. Similarly for Q21 enhanced and Q22 depleted, X2 is low and for Q21 depleted and Q22 enhanced, X2 is high.

For the programming of transistors Q11, Q21, Q12 and Q22 shown in FIG. 2 where Q12 and Q21 are depleted, X1 is set low and X2 is set high. For this condition, Z2 is driven high whenever the input signal S generated by the user is high.

For the programming condition where Q12 and Q22 are depleted, X1 and X2 are set low. For this condition, Z2 is driven high whenever the input signal S generated by the user is low.

For the programming condition where only Q11 is depleted and Q21 is depleted, X1 and X2 are set high. For this condition, Z2 is held high regardless of the value of the signal applied to terminal 11 by the user. That is, ROM 12 is always enabled in this example.

The operation of the circuitry shown in FIG. 2 need not be greatly detailed. Suffice it to say that when X1 is low, P1 is turned-on and N1 is turned-off. P2 and N2 then function as an inverter in response to the input signal S such that Z1 is equal to $\overline{S}$. For the condition where X1 is high, P1 is turned-off and N1 is turned-on, clamping Z1 to ground, with Z1 remaining at ground regardless of the value of the input signal S. Also, for this condition, no current is drawn by the circuit regardless of the value of S. Thus, the user may ignore or float terminal 11. When X2 is high, transistor N3 is turned-on while transistor P5 is turned-off. Concurrently, $\overline{X2}$-low is produced by transistors P6 and N6 turning-on P3 and turning-off N5. For the condition of Z1 being high, P4 is turned-off while N4 is turned-on, clamping Z2 to ground.

For the condition of Z1 being low while X2 is high, P4 is turned-on and N4 is turned-off causing Z2 to be clamped to $V_{DD}$ and producing a high Z2 output.

When X2 is low, N3 is turned-off and P5 is turned-on. Concurrently, $\overline{X2}$, at the output of P6 and N6, is high turning-off P3 and turning-on N5. Consequently, when X2 is low, Z1 is coupled to the output (Z2) via the parallel conduction paths of N5 and P5 and Z2 assumes the value of Z1. Thus, if Z1 is low when X2 is low, Z2 goes low; and if Z1 is high when X2 is low, Z2 goes high. The relationships of X1, S and Z1 and of X2, Z1 and Z2 are summarized in TABLES 1A and 1B below.

TABLE 1A

| X1 | S | Z1 |
|---|---|---|
| LO | HI | LO |
| LO | LO | HI |
| HI | HI | LO |
| HI | LO | LO |

TABLE 1B

| X2 | Z1 | Z2 |
|---|---|---|
| HI | HI | LO |
| HI | LO | HI |
| LO | LO | LO |
| LO | HI | HI |

FIG. 3B shows an alternative transistor realization of the level programming switch pairs shown in FIGS. 2 and 3A. In FIG. 3B, all the transistors are connected to a common substrate. In accordance with FIG. 3A, the "upper" transistors—(i.e. Qi1)—are formed in a separate "well" enabling their source and substrate to be connected in common. In the configurations of FIGS. 3A and 3B, a full $V_{DD}$ or ground voltage is produced at the switching circuit outputs, depending on which transistor (Qi1 or Qi2 respectively) is programmed as the depletion device. The configuration of FIG. 3A with the upper transistor's substrate connected to its source, is preferred because it eliminates the "body effect", i.e. a source-to-substrate reverse bias. This might otherwise limit the voltage to which the source of Qi1 could rise. As already stated, for a ROM chip in which the bit pattern is determined by selective depletion implant, the configurations of FIGS. 3A or 3B facilitate simultaneous programming of buffer logic function and bit pattern.

In FIG. 2, the logic gating is implemented using complementary metal oxide semiconductor (CMOS) devices. This assures that no static current is drawn by the circuit.

The switching networks SW1 and SW2 although formed using like conductivity devices, do not dissipate any steady state current since one of the two transistors in each string is normally turned off.

The particular placement of gate G1 avoids any current flow during the "don't care" programmed state regardless of the voltage applied to input pin 11. This eliminates the need for using either external pull-up resistors, special wire bonding or other cut off means.

The invention has been illustrated with a ROM 12 in which the memory elements are stacked. It should be evident that any other suitable type of ROM could be used instead. Furthermore, it should be evident that the programmable buffer of the invention is not limited to interfacing different customer signals to a ROM but could also be used to interface a variety of different customer signals to random access memories (RAMs) or different types of logic circuits, when these RAMs and logic circuits are designed to be operated by some standard signals.

The description above assumed that the ROM was of the type which could be programmed by ion implantations to alter the characteristics of the memory devices and selected devices in the programmable buffer. However, it should be evident that many other different structures could be used to practice the invention, and to produce control signals X1 and X2.

The invention has been illustrated assuming that the switching network and ROM transistors were initially formed as enhancement type transistors and that subsequently selected ones were programmed to become depletion type transistors. However, the converse is of course included. That is, these transistors may be initially formed as depletion type transistors and subsequently selected transistors may be processed to become enhancement type.

The transistors shown in FIGS. 2 and 3 are formed in bulk silicon. However, it should be evident that this transistor could be formed using the silicon-on-sapphire (SOS) technology wherein each transistors has a floating local substrate.

The invention has also been illustrated assuming that a high signal was necessary to enable ROM 12. It should be evident that the ROM (or whatever device is to be driven) may require a "low" enabling signal. In such a case the logic circuitry of the buffer would be readily configured to accommodate this need.

What is claimed is:

1. A programmable buffer comprising:
    an input terminal for receiving different valued input signals;
    an output terminal for producing thereat a "standard" enabling signal of first value;
    control means for producing first and second control signals having either binary value;
    first and second means, each one of said first and second means having first and second inputs and an output;
    means connecting the first input of said first means to said input terminal and its second input to said control means; said first means being responsive to one binary value of said first control signal for producing at its output a signal which is the inverse of the signal at said input terminal and being responsive to said other binary value of said first control signal for then producing at its output a signal having only one of said binary values regardless of the value of said input signal; and
    means connecting said first input of said second means to said output of said first means, its second input to said control means and its output to said output terminal; said second means being responsive to the output of said first means and to said second control signal for producing a signal at its output having one binary value when the signals at its first and second inputs have the same binary value and for producing a signal at its output having the other binary value when the signals at its first and second inputs have different binary values;
    said first and second means being responsive to said first and second control signals for producing said standard enabling signal of first value at said output terminal in response to either of the following:
    (a) a signal at said input terminal having a first value for one condition of said control signals; or
    (b) a signal at said input terminal having a different value than said first value for a second condition of said control signals; or
    (c) regardless of the value of the input signal at said input terminal for a third condition of said control signals.

2. The combination as claimed in claim 1 wherein said means for producing said first and second control signal means includes first and second transistors, each transistor having a control electrode and a conduction path and wherein the first transistor is connected between a first point of operating potential and a control signal node and wherein the second transistor is connected between said control signal node and a second point of operating potential.

3. The combination as claimd in claim 2 wherein said first and second transistors are insulated-gate field-effect transistors, and wherein one of said first and second transistors is an enhancement type IGFET connected to be normally non-conducting and wherein the other one of said first and second transistors is a depletion type transistor providing a relatively low impedance conduction path.

4. The combination as claimed in claim 1 wherein said first means is a two-input NOR gate and wherein said second means is a two-input exclusive-OR gate;
    wherein one of said controls signals and the signals at said input terminal are applied to said NOR gate;
    wherein the output of said NOR gate and said second control signal are applied to the input of said exclusive-OR gate; and
    wherein the output of said exclusive-OR gate is connected to said output terminal.

5. The combination as claimed in claim 1 wherein said programmable buffer is formed on an integrated circuit (IC) including a read only memory circuit having a chip select input, and
    wherein said output terminal of said programmable buffer is connected to said chip select input.

6. A programmable buffer for producing a "standard" output enabling signal of first value in response to a "non-standard" enabling input signal having either said first value, or either one of said first and second values, comprising:
    an input terminal for the application thereto of said non-standard enabling input signal;
    means for selectively producing first and second control signals having either binary condition;
    first means having an input coupled to said input terminal and being responsive to one binary value of said first control signal for producing at its output a signal which is the inverse of the signal at said input terminal and being responsive to said other binary value of said first control signal for then producing at its output a signal having only one of said binary values regardless of the value of said input signal; and second means responsive to the output of said first means and to said second control signal for producing, in response to one value of said second control signal, an output in phase with said input signal and for producing, in response to the other value of said control signal, an output of opposite phase to said input signal.

7. In combination with a standard circuit designed to be enabled in response to a standard enabling signal of first value and wherein said circuit is extended for use by different users supplying differently valued enabling signals at an output terminal, a programmable buffer circuit coupled between said input terminal and said standard circuit for converting the different user signals to standard enabling signals comprising:

an input terminal for receiving said user supplied different valued enabling signals;

an output terminal for producing thereat said standard enabling signals;

settable buffer means coupled between said input and output terminals comprising:

(a) first means having a first input coupled to said input terminal and having a second input and an output, said first means being responsive to one binary value of signal applied to its second input for producing at its output a signal which is the inverse of the signal at said input terminal and being responsive to the other binary value of signal applied to its second input for then producing at its output a signal having only one of said binary values regardless of the value of the signal at said input terminal; and (b) second means having first and second inputs and an output, with its first input being connected to the output of said first means and its output being connected to said output terminal; said second means being responsive to the signals at its first and second inputs for producing a signal at its output having one binary value when the signals at its input have the same binary value and for producing a signal at its output having the other binary value when the signals at its input have different binary values; and control means coupled to said second inputs of said first and second means for configuring said settable buffer means to function:

(a) as a non-inverting buffer; or
(b) as an inverting buffer; or
(c) to produce a fixed output regardless of the value of the signal at said input terminal.

8. A programmable buffer comprising:

an input terminal for receiving different valued input signals;

an output terminal for producing thereat a "standard" enabling signal of first value;

means for producing first and second control signals having either binary value; and means comprising a two-input NOR gate having an output and a two-input exclusive-OR gate having an output, including means for applying said first control signal and the input signals at said input terminal to said input of said NOR gate, and including means for applying the output of said NOR gate and said second control signal to said input of said exclusive-OR gate, including means connecting the output of said exclusive-OR gate to said output terminal for producing said standard enabling signal of first value at said output terminal in response to either of the following:

(a) a signal at its input of said first value for one condition of said control signals; or
(b) a signal at its input of different value than said first value for a second condition of said control signals; or
(c) regardless of the value of the input signal at its input for a third condition of said control signals, 9. A programmable buffer formed on an integrated circuit (IC) which includes a read only memory (ROM) circuit having a chip sleect input, said programmable buffer comprising:

an input terminal for receiving different valued input signals;

an output terminal coupled to said chip select input of said ROM for selectively producing thereat a "standard" enabling signal of first value to select said ROM circuit;

means for producing first and second control signals having either binary value; and means coupled between said input and output terminals responsive to said first and second control signals for producing said standard enabling signal of first value at said output terminal in response to either of the following:

(a) a signal at its input of said first value for one condition of said control signals; or
(b) a signal at its input of different value than said first value for a second condition of said control signals; or
(c) regardless of the value of the input signal at its input for a third condition of said control signals.

* * * * *

UNITED STATES PATENT AND TRADEMARK OFFICE
CERTIFICATE OF CORRECTION

PATENT NO. : 4,612,459

DATED : Sep. 16, 1986

INVENTOR(S) : Robert G. Pollachek

It is certified that error appears in the above-identified patent and that said Letters Patent is hereby corrected as shown below:

Col. 1, line 51, change "invehtion" to - - - invention - - -.

Col. 4, line 18, change "VDD" to - - - $V_{DD}$ - - -.

Col. 8, line 26, change "claimd" to - - - claimed - - -.

Col. 8, line 54, after "first value," insert - - - a second value other than said first value,- - -.

Col. 9, line 10, change "extended" to - - - intended - - -.

Col. 10, line 26, after "signals" change the comma to a period.

Col. 10, line 29, change "sleect" to - - - select - - -.

Signed and Sealed this

Second Day of December, 1986

Attest:

DONALD J. QUIGG

Attesting Officer

Commissioner of Patents and Trademarks